(12) United States Patent
Marchal et al.

(10) Patent No.: US 10,886,090 B2
(45) Date of Patent: Jan. 5, 2021

(54) METHOD AND DEVICE FOR PROTECTING AN ELECTRICAL ARCHITECTURE

(71) Applicant: RENAULT s.a.s., Boulogne-Billancourt (FR)

(72) Inventors: Caroline Marchal, Paris (FR); Philippe Recouvreur, Montrouge (FR)

(73) Assignee: RENAULT s.a.s., Boulogne-Billancourt (FR)

( * ) Notice: Subject to any disclaimer, the term of this patent is extended or adjusted under 35 U.S.C. 154(b) by 254 days.

(21) Appl. No.: 16/070,807

(22) PCT Filed: Jan. 13, 2017

(86) PCT No.: PCT/FR2017/050086
§ 371 (c)(1),
(2) Date: Jul. 18, 2018

(87) PCT Pub. No.: WO2017/125668
PCT Pub. Date: Jul. 27, 2017

(65) Prior Publication Data
US 2019/0035591 A1    Jan. 31, 2019

(30) Foreign Application Priority Data
Jan. 19, 2016 (FR) ...................... 16 50416

(51) Int. Cl.
*H01H 85/30* (2006.01)
*H01H 85/46* (2006.01)
(Continued)

(52) U.S. Cl.
CPC .......... *H01H 85/30* (2013.01); *B60L 3/0046* (2013.01); *B60L 3/04* (2013.01); *B60L 50/64* (2019.02);
(Continued)

(58) Field of Classification Search
CPC .... H01H 85/30; H01H 85/0013; H01H 85/46; B60L 50/64; B60L 3/0046; B60L 3/04;
(Continued)

(56) References Cited

U.S. PATENT DOCUMENTS 7,724,122 B2 * 5/2010 Leach .................... H01H 85/36
337/123
9,324,533 B2 * 4/2016 Horne .................... H01H 85/44
(Continued)

FOREIGN PATENT DOCUMENTS

DE    202 14 002 U1    11/2002
WO    WO 2008/098532 A1    8/2008

OTHER PUBLICATIONS

International Search Report dated May 22, 2017 in PCT/FR2017/050086 filed Jan. 13, 2017.
(Continued)

*Primary Examiner* — Adolf D Berhane
(74) *Attorney, Agent, or Firm* — Oblon, McClelland, Maier & Neustadt, L.L.P.

(57) ABSTRACT

A method is for protecting an electrical architecture including a protective device provided with a protective fuse capable of melting in a deteriorated mode of operation during which a breaking current having an amperage greater than a threshold is flowing through the architecture. The method includes, in a nominal mode of operation, periodically estimating a temperature of the fuse and controlling an amperage of a useful current flowing through the fuse such that the estimated temperature remains below a melting temperature of the fuse.

14 Claims, 3 Drawing Sheets

(51) Int. Cl.
   *B60L 3/00* (2019.01)
   *H02H 9/02* (2006.01)
   *B60L 3/04* (2006.01)
   *B60L 50/64* (2019.01)
   *G01K 3/00* (2006.01)
   *G05B 13/02* (2006.01)
   *G01R 31/74* (2020.01)
   *G01R 19/30* (2006.01)

(52) U.S. Cl.
   CPC ........... *G01K 3/005* (2013.01); *G05B 13/024* (2013.01); *H01H 85/46* (2013.01); *H02H 9/02* (2013.01); *B60L 2240/545* (2013.01); *G01R 19/30* (2013.01); *G01R 31/74* (2020.01); *Y02T 10/70* (2013.01)

(58) Field of Classification Search
   CPC . B60L 2240/545; G01K 3/005; G05B 13/024; H02H 9/02; G01R 31/74; G01R 19/30; Y02T 10/005; Y02T 10/705
   See application file for complete search history.

(56) References Cited

U.S. PATENT DOCUMENTS

| | | | |
|---|---|---|---|
| 2004/0036480 A1 | 2/2004 | Lin | |
| 2009/0147420 A1* | 6/2009 | Graf | H03K 17/0822 361/56 |
| 2011/0291481 A1* | 12/2011 | Matsumoto | H01H 85/46 307/52 |
| 2013/0002393 A1* | 1/2013 | Kopcic | H01H 85/306 337/227 |
| 2014/0218159 A1* | 8/2014 | Wosgien | H01H 85/30 337/206 |
| 2014/0334052 A1* | 11/2014 | Hebert | H01C 7/021 361/93.9 |
| 2019/0371560 A1* | 12/2019 | Sirigineedi | G01R 31/74 |
| 2020/0144013 A1* | 5/2020 | Kishi | H01H 85/055 |

OTHER PUBLICATIONS

French Preliminary Search Report dated Oct. 17, 2016 in French Application 1650416 filed Jan. 19, 2016.

* cited by examiner

METHOD AND DEVICE FOR PROTECTING AN ELECTRICAL ARCHITECTURE

The present invention relates to a method for protecting an electrical architecture contained in particular in a vehicle and comprising a protective fuse, and to a protective device for implementing this method.

The invention also relates to a computer program and to a vehicle, in particular a motor vehicle, including such a protective device.

The prior art discloses a vehicle electrical architecture such as the one that is described in document FR2967823, comprising a protective device and a battery that is provided with modules that are linked electrically to one another by joining bars. This protective device is defined so as to detect heating at the joining bars before this is transmitted to the modules of the battery and thus prevent any damage to said battery. To this end, this protective device comprises a processing unit linked to thermal fuses that are arranged at various defined areas on these joining bars. Thus, as soon as one of these zones experiences a temperature rise that goes beyond a predefined threshold, the corresponding fuse melts and the computer activates a mode of impaired use of the battery, corresponding to a limitation of a charge or discharge current of said battery below a certain threshold.

However, one of the major drawbacks of such a protective device is linked to the fact that it is necessary to systematically replace the defective thermal fuse, which has melted, in order for this device to become operational again and for the operation of the battery, and by extension that of the vehicle in which it is arranged, not to be altered thereby.

Furthermore, such a protective device also has a high implementation and operating cost that is linked for example to the replacement of the defective fuses.

The present invention aims to mitigate these drawbacks linked to the protective devices and methods from the prior art.

To this end, the invention relates to a method for protecting an electrical architecture comprising a protective device provided with a protective fuse that is able to melt in an impaired mode of operation during which a break current, with a magnitude higher than a threshold, flows in the architecture, the method furthermore including, in a nominal mode of operation, the following steps:
periodically estimating a temperature of said fuse, and
controlling a magnitude of a useful current flowing in said fuse such that the estimated temperature remains lower than a melting temperature of said fuse.
In other embodiments:
the method comprises a step of defining a first limit setpoint for the magnitude of the current at a first maximum magnitude flowing in said fuse;
the control step comprises a step of defining a second limit setpoint for the useful current magnitude at a second maximum magnitude of the current if the estimated temperature is higher than a threshold temperature;
the step of periodically estimating the temperature of the fuse comprises:
a step of measuring the temperature of the fuse, in particular of a strip of the fuse, or
a step of measuring the magnitude of the current flowing in said fuse, in particular a strip of the fuse, and
a step of calculating the temperature on the basis of the measured magnitude and of a data model linking temperatures with magnitudes relating to said fuse;
the method comprises a step of determining a threshold temperature on the basis of a difference between the melting temperature of the fuse and a temperature variation relating to a power that the fuse is liable to dissipate, this power being lower than a melting power of this fuse;
the estimation step comprises a step of adjusting a measured or calculated temperature of the fuse on the basis of a determined ambient temperature of said fuse, and/or
the estimation and control steps are implemented by an analog or PID controller algorithm.

The invention also relates to a device for protecting an electrical architecture implementing such a protection method, the device including a protective fuse able to melt in an impaired mode of operation during which a break current, with a magnitude higher than a threshold, flows in the architecture, the device furthermore including, in a nominal mode of operation:
an element for periodically estimating a temperature of said fuse, and
an element for controlling a magnitude of a useful current flowing in said fuse such that the estimated temperature remains lower than a melting temperature of said fuse.
In other embodiments:
the estimation element comprises a processing unit, at least one sensor for sensing the temperature of the fuse, a device for determining an ambient temperature of the fuse and/or at least one device for measuring the magnitude of the current flowing in said fuse;
the control element comprises the processing unit and a device for controlling the magnitude of the current flowing in the fuse, and/or
the processing unit is connected to said at least one temperature sensor, to the devices for measuring and controlling the magnitude of the current flowing in the fuse, and to the device for determining an ambient temperature of the fuse.

The invention also relates to a computer program comprising program code instructions for executing the steps of such a method when said program is executed by a processing unit.

The invention furthermore relates to a vehicle, in particular an electric or hybrid vehicle, comprising an electrical architecture provided with such a protective device.

Other advantages and features of the invention will become more apparent upon reading the following description of one preferred embodiment, with reference to the figures, given by way of non-limiting indicative example:

Figure 5A:
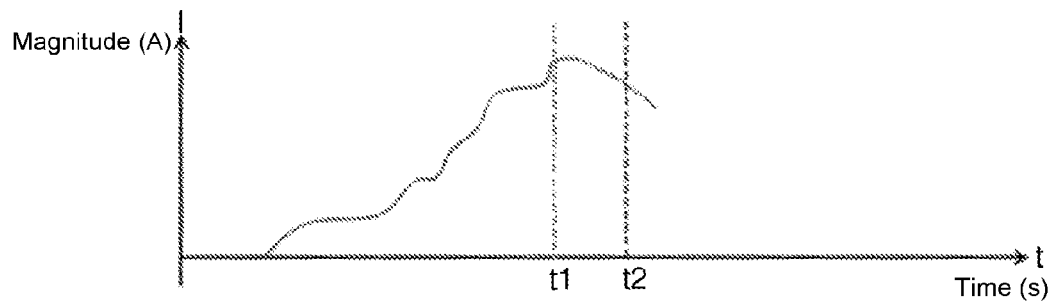
Figure 5B:
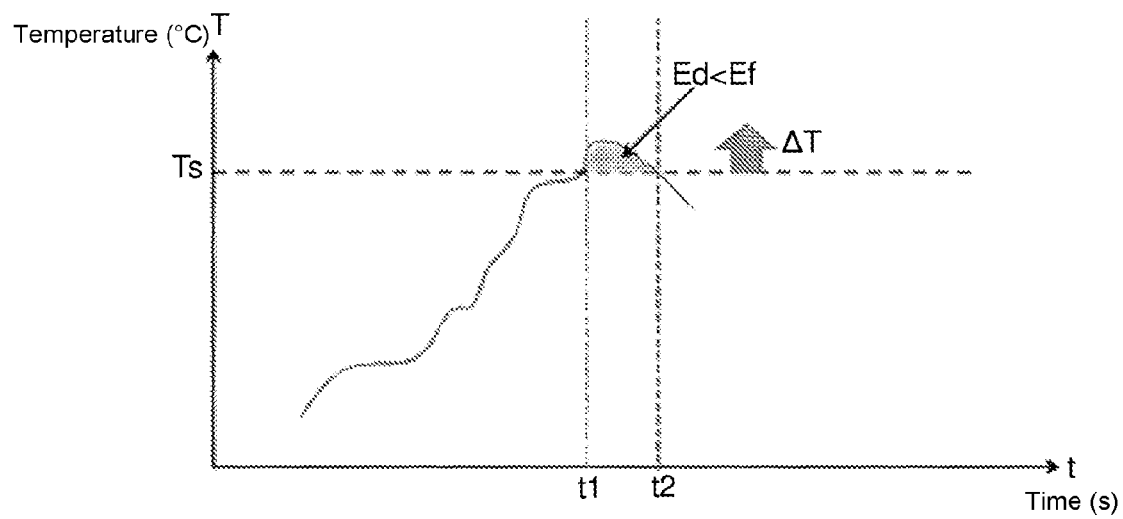

FIG. 5A is a graph of the magnitude of the current flowing in the fuse as a function of time, relating to a third variant of the step of controlling this magnitude of the protection method according to the embodiment of the invention, and FIG. 5B is a graph of the temperature of the fuse as a function of time, relating to the third variant of the control step according to the embodiment of the invention.

Figure 1:
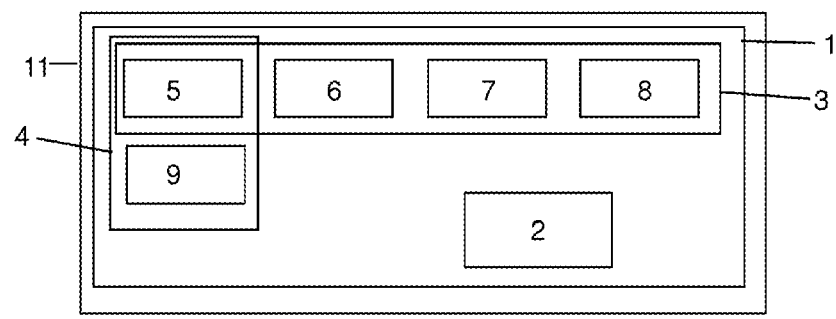
FIG. 1 shows a schematic view of a protective device contained in an electrical architecture according to the embodiment of the invention.

In one embodiment, shown in FIG. 1, the device 1 for protecting an electrical architecture 11 comprises a protective fuse 2, an element 3 for estimating a temperature Te of the fuse 2 and an element 4 for controlling a magnitude I of a useful current flowing in said fuse 2. Such a protective device 1 is preferably implemented within an electrical architecture 11 of a motor vehicle, in particular of an electric or else hybrid vehicle.

Figure 2:
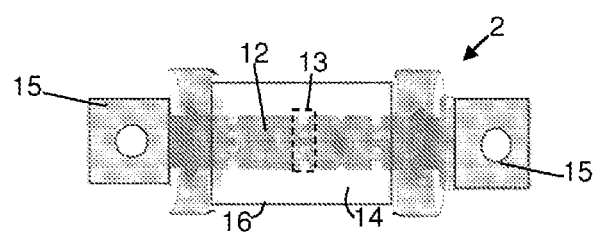
FIG. 2 shows a schematic view of a protective fuse according to the embodiment of the invention.

The fuse 2 illustrated in FIGS. 1 and 2 is able to melt in an impaired mode of operation during which a break/overload current, with a magnitude higher than a threshold, flows in the architecture 11. This impaired mode of operation may be defined as being an immobilizing fault situation.

This fuse 2 comprises a metal strip 12, also called fuse link 2, for example made of copper and including a sensitive melting area 13 configured to melt when the highest magnitude of the break current is higher than a threshold. The strip 12 comprises two ends that are each provided with a connecting tab 15. Such connecting tabs 15 are defined so as to be connected to an electrical circuit of the electrical architecture 11. In this fuse 2, this tab 12 is contained in a casing 16 that forms a closed envelope containing sand 14, allowing the sensitive area 13 to be quickly cut off when it has melted, by avoiding a flow of current being continued through an electric arc.

As we have seen, this device 1 comprises, in a nominal mode of operation, an element 3 for periodically estimating a temperature Te of said fuse 2, and an element 4 for controlling the current of magnitude I flowing in the fuse 2 and therefore in the strip 12 of said fuse.

The periodic estimation element 3 comprises a processing unit 5, a device 6 for measuring the magnitude I of the current flowing in said fuse 2 and at least one sensor 7 for sensing the temperature of the fuse 2, which sensor may be arranged on the connecting tab of the fuse 2. This estimation element 3 also comprises a device 8 for determining the ambient temperature of the fuse 2, which device is for example an ambient temperature sensor arranged in an immediate environment of the fuse 2. The processing unit 5 may be an on-board computer of the vehicle comprising at least one calculating unit provided with hardware and software resources, more precisely with at least one processor interacting with memory elements. This processing unit 5 is able to execute instructions for implementing a computer program.

The control element 4 comprises the processing unit 5 and a device 9 for controlling the magnitude I of the current flowing in the fuse 2.

Under these conditions, the processing unit 5 is connected to the temperature sensor 7 and to the devices 6, 9 for measuring and controlling the magnitude I of the current flowing in the fuse 2 and to the device 8 for determining the ambient temperature of the fuse 2.

In this protective device 1, the memory elements of the processing unit 5 comprise a data model relating to said fuse 2 and linking strip 12 temperatures of the fuse 2 and magnitudes liable to flow through the strip. This data model is defined as a function of the features of the fuse of this protective device 1. This data model may be obtained either after experimental measurements of temperature and of current magnitude flowing in the fuse 2, for example by varying this magnitude, or after calculation taking into account the technical features of the fuse 2. In this data model, the temperatures and magnitudes may take into account ambient temperatures of the fuse 2. Such a data model is determined beforehand and archived in the memory elements of the processing unit 5.

The memory elements of the processing unit 5 also comprise an analog or PID (acronym for 'Proportional Integral Derivative') controller calculation algorithm in particular for implementing a control step, described hereinafter, of the method.

Figure 3:
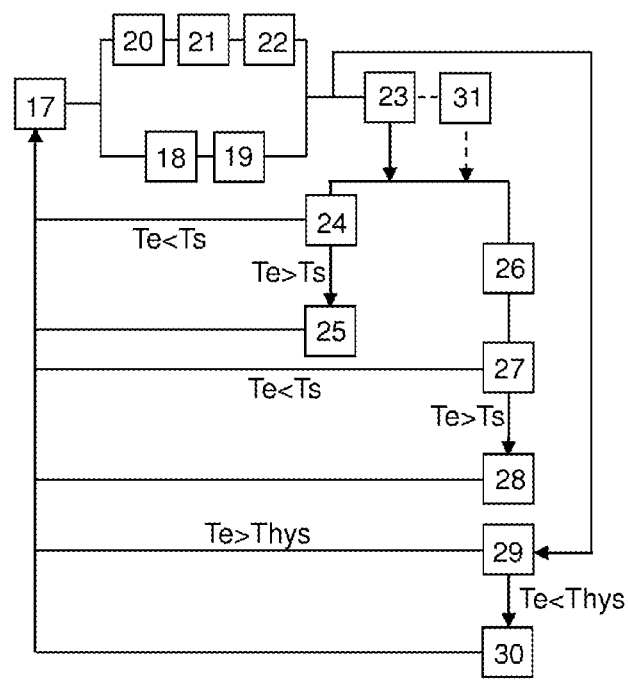
FIG. 3 is a flow chart relating to a method for protecting an electrical architecture according to the embodiment of the invention.

With reference to FIG. 3, the device 1 is able to implement a method for protecting this electrical architecture 11 comprising such a device 1 provided with this protective fuse 2.

In a nominal mode of operation, this method comprises a step 17 of periodically estimating the temperature Te of the fuse 2. In this step 17, the temperature Te may be evaluated in accordance with two alternatives. Specifically, in the first alternative, the estimation step 17 comprises a step 18 of measuring this temperature Te of the fuse 2, in particular of the strip 12 of the fuse 2, using the processing unit 5 that is linked to the temperature sensor 7 that is arranged at one of the connecting tabs 15 of the fuse 2. In this first alternative, the estimation step 17 may comprise a step 19 of adjusting this measured temperature on the basis of a determined ambient temperature Ta of said fuse 2. More precisely, in this adjustment step 19, the ambient temperature Ta present in the immediate environment of the fuse 2 is measured using the processing unit 5 that is connected to the device 8 for determining this ambient temperature of the fuse 2. This ambient temperature Ta is then taken into account by the processing unit 5 in order to estimate the temperature Te of the fuse 2.

In the second alternative, the estimation step 17 comprises a step 20 of measuring the magnitude I of the current flowing in the fuse 2 using the processing unit 5 that is linked to the device 6 for measuring the magnitude I of the current flowing in the fuse 2. This measurement step 20 comprises a step 21 of calculating the temperature Te on the basis of the measured magnitude I and of the data model relating to said fuse 2 and linking strip 12 temperatures of the fuse 2 with magnitudes liable to flow through the strip. In this second alternative, the estimation step 17 may comprise a step 22 of adjusting this temperature on the basis of a determined ambient temperature Ta of said fuse 2. More precisely, in the data model, the determined temperature of the fuse 2 for a given magnitude may be adjusted as a function of the ambient temperature Ta present in the immediate environment of the fuse 2, which ambient temperature Ta is measured using the processing unit 5 that is connected to the device 8 for determining the ambient temperature of the fuse 2.

The method then comprises a step 23 of controlling the magnitude I of the useful current flowing in the fuse 2, such that the estimated temperature Te of said fuse remains lower than a melting temperature Tf of the fuse 2. This melting temperature Tf corresponds to the temperature at which the strip 12 of the fuse 2 is liable to melt when a break/overload current flows in the fuse 2, causing said fuse to melt under the effect of a melting power Ef that melts the strip 12 of this fuse 2. This step 23 of controlling the magnitude I may be implemented in accordance with three variants. In the context of performing this control step 23, the processing unit 5 implements a mechanism for controlling the magnitude I flowing in the fuse 2 using the analog or PID (acronym for 'Proportional Integral Derivative') controller calculation algorithm preferably comprising a proportional component and/or integral component. More precisely, the processing unit 5, by executing this algorithm, is able to perform the various variants of this control step 23.

In the first variant, this control step 23 comprises a step of comparing the temperature Te with a threshold temperature Ts. This threshold temperature Ts, which is lower than the melting temperature Tf, corresponds to a temperature at which the features of the fuse 2 and therefore of the strip 12 have been defined for optimal operation of said fuse.

Under these conditions, if the estimated temperature Te is lower than the threshold temperature Ts, i.e. Te<Ts, then the magnitude I of the current flowing in the fuse 2 is not changed. Hence, the method then provides for performing the step 17 of periodically estimating the temperature Te again.

By contrast, if the estimated temperature Te is higher than the threshold temperature Ts, i.e. Te>Ts, then the control step 23 comprises a step 25 of defining a second limit setpoint for the magnitude I of the current at a second maximum magnitude Im2. This maximum magnitude Im2 of the current corresponds to a magnitude tailored to the technical features of the fuse 2 and therefore of the strip, so as to ensure optimal operation of this fuse 2. Thereafter, the method provides for performing the step 17 of periodically estimating the temperature Te again. In this configuration, the magnitude I of the current flowing in the fuse 2 is then kept at a value lower than or equal to that of the second maximum magnitude Im2, thereby making it possible to avoid the temperature Te of the fuse that is measured periodically from reaching the melting temperature Tf.

In the second variant, the control step comprises a step 26 of defining a first maximum magnitude Im1 of the magnitude I of the useful current flowing in said fuse 2. More precisely, in this step 26, the magnitude I of the current flowing in the fuse 2 must not exceed this first maximum magnitude Im1, that is to say that the magnitude I flowing through the strip 12 of this fuse 2 is lower than or equal to this first maximum magnitude Im1, i.e. I≤Im1. In this variant, the control step 23 also comprises a step 27 of comparing the estimated temperature Te with the threshold temperature Ts. Under these conditions, if the estimated temperature Te is lower than the threshold temperature Ts, i.e. Te<Ts, then the magnitude I of the current flowing in the fuse 2 is not changed. Hence, the method then provides for performing the step 17 of periodically estimating the temperature Te again.

By contrast, if the estimated temperature Te is higher than the threshold temperature Ts, i.e. Te>Ts, then the control step 23 comprises a step 28 of defining the second limit setpoint for the magnitude I of the current at the second maximum magnitude Im2. This second maximum magnitude Im2 is lower than the first maximum magnitude Im1. The control step 23 then provides for performing the step 17 of periodically estimating the temperature Te of the fuse 2, and then comprises a new step 29 of comparing the estimated temperature Te with a hysteresis temperature Thys. Under these conditions, if the estimated temperature Te is lower than the hysteresis temperature Thys, i.e. Te<Thys, then the control step 23 provides a step 30 of canceling the second limit setpoint. Thereafter, the estimation 17 and control 23 steps are performed again. It will be noted that, by contrast, if the estimated temperature Te is higher than the hysteresis temperature Thys, i.e. Te>Thys, then the estimation 17 and comparison 29 steps are performed again. It will be noted by way of example in FIG. 4C, the threshold temperature is 145° C. and the hysteresis temperature Thys is 100° C.

Figure 4A:
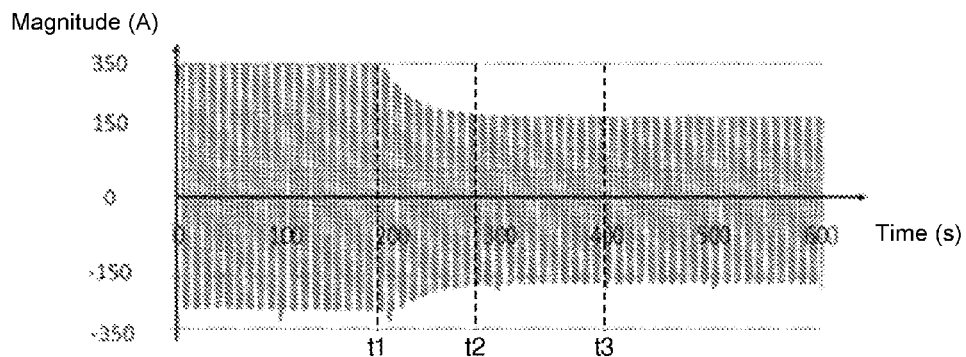
FIG. 4A is a graph of a magnitude of a current flowing in the fuse as a function of time, relating to a second variant of a step of controlling this magnitude of the protection method according to the embodiment of the invention.
Figure 4B:
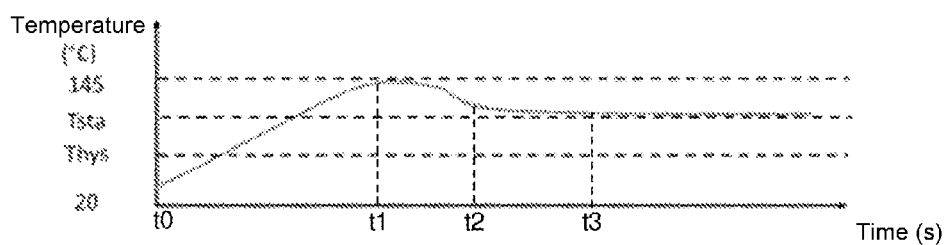
FIG. 4B is a graph of a temperature of the fuse as a function of time, relating to the second variant of the control step according to the embodiment of the invention.
Figure 4C:
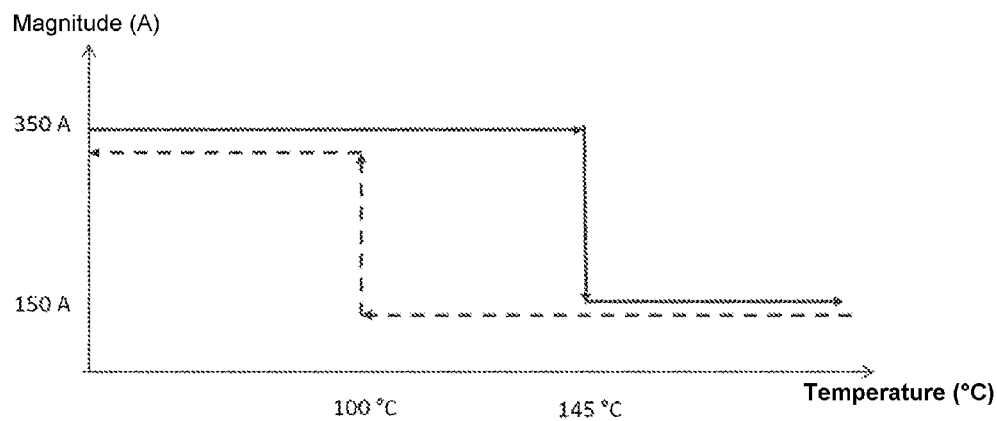
FIG. 4C is a graph of the magnitude flowing in the fuse as a function of the temperature of the fuse, relating to the second variant of the control step according to the embodiment of the invention.

With reference to FIGS. 4A to 4C, in one example illustrating this variant of the method of the control step 23, between instants t0 and t1, the magnitude I of the current flowing in this fuse 2 is limited to the first maximum magnitude Im1, which is 350 A in this case, after the step 26 of defining the first setpoint has been performed. Between these instants t0 and t1, the periodically estimated temperature Te gradually increases until this temperature Te exceeds the threshold temperature Ts, which is in this case 145° C. Hence, under these conditions, with the estimated temperature Te at the instant t1 being higher than the threshold temperature Ts, i.e. Te>Ts, the magnitude I of the current flowing in the fuse 2 is then limited to the second maximum magnitude Im2, which is in this case 150 A, after the step 28 of defining the second setpoint has been implemented. Thus, between instants t1 and t2, the magnitude I decreases until it reaches the second maximum magnitude Im2. Such a reduction in the magnitude I also brings about a drop in the temperature Te. In particular, this temperature Te continues to drop until an instant t3, at which it converges towards a stable temperature Tsta, in this case of 120° C. Then, insofar as the estimated temperature Te is lower than the hysteresis temperature, which is in this case 100° C., the control step 23 then provides the step 30 of canceling the second limit setpoint.

It will be noted that, in these first and second variants, the PID controller preferably comprises only the proportional component and may thus be defined by the following equation:

$$IM2 = Kp \times (Te - Ts),$$

where Kp corresponds to the proportional gain.

In the third variant, this method comprises a control step 23 similar to the one described in the context of the first or the second variant. Unlike these two variants, in this third variant, the method comprises a step 31 of determining a threshold temperature Ts on the basis of the difference between the melting temperature Tf of the fuse 2 and of a temperature variation ΔT relating to a power Ed that the fuse 2 is liable to dissipate and that is lower than the melting power Ef of this fuse 2, i.e. Ed<Ef, visible in FIG. 5. More precisely, this power Ed is defined by the following equation:

$$Ed = mCp \int \Delta T dt,$$

where m is the mass of the strip 12 of the fuse 2 and Cp its heating capacity.

With reference to FIGS. 5A and 5B, in this third variant, when the estimated temperature Te is higher than this threshold temperature Ts thus determined, i.e. Te>Ts, then at an instant t1 the control step 23 implements the step 24, 27 of defining the second limit setpoint for the current magnitude I at the second maximum magnitude Im2 of the current, and does so until an instant t2 at which the estimated temperature Te is lower than the threshold temperature Ts. Thus, between the instants t1 and t2, this magnitude I is reduced gradually and continually as soon as the temperature Te is higher than the threshold temperature Ts without reaching the melting temperature Tf of the fuse 2. In other words, the threshold temperature Ts thus determined is therefore very close to the melting temperature Tf. In this third variant, the control step 23 makes it possible to control the magnitude I of the current and therefore the temperature Te of the fuse 2 as accurately as possible. It will be noted that the threshold temperature Ts thus determined is higher than the experimental/theoretical threshold temperature of the fuse 2 that is used in particular in the context of the first and second variants, but lower than the melting temperature Tf of the fuse 2.

In this third variant, the PID controller may comprise the proportional and integral components, and correspond to the following equation: $Im2=Kp\times(Te-Ts)+KI\times\int\Delta Tdt$, where Kp is the proportional gain and KI the integral gain.

Furthermore, this method may comprise a step of alerting a user of the vehicle comprising such an electrical architecture 11 when, in the variants of the control step 23, the step 24, 27 of defining the second setpoint is performed. This alert step may then comprise a step of transmission, by the processing unit 5, of a message to the dashboard of this vehicle or else an acoustic signal.

Advantageously, this device 1 and this method make it possible to ensure that the fuse 2 is protected against its own thermal drift and keep the temperature of said fuse in a temperature zone in which its operation is optimal. In addition, they also make it possible to take into account the dynamics and the thermal response time of the fuse 2.

The invention also relates to the computer program comprising program code instructions for executing the steps of the method for protecting the electrical architecture 11 of a vehicle. In this embodiment, this program is executed by the processing unit 5 of the protective device 1.

The invention claimed is:

1. A method for protecting an electrical architecture comprising a protective device provided with a protective fuse that is able to melt in an impaired mode of operation during which a break current, with a magnitude higher than a threshold, flows in the architecture, the method comprising, in a nominal mode of operation, the following:
   periodically estimating a temperature of said fuse, and
   controlling a magnitude of a useful current flowing in said fuse such that the estimated temperature remains lower than a melting temperature of said fuse,
   wherein said controlling the magnitude of useful current reduces the temperature of said fuse to below a threshold fuse temperature, responsive to said periodically estimating the temperature resulting in the estimated temperature of the fuse exceeding the threshold fuse temperature, while at the same time limiting the useful current flowing in said fuse to no more than a second maximum magnitude, and
   wherein the threshold fuse temperature is less than the melting temperature of said fuse.

2. The method as claimed in claim 1, further comprising defining a first limit setpoint for the magnitude of the current at a first maximum magnitude flowing in said fuse.

3. The method as claimed in claim 1, wherein said controlling comprises defining the second maximum magnitude as a second limit setpoint for the useful current magnitude when the estimated temperature of said fuse is higher than the threshold fuse temperature.

4. The method as claimed in claim 1, wherein said periodically estimating the temperature of the fuse comprises:
   measuring the magnitude of the current flowing in said fuse, and
   calculating the temperature of the fuse based on the measured magnitude of the current flowing in said fuse and of a data model linking temperatures with magnitudes relating to said fuse.

5. The method as claimed in claim 1, wherein said periodically estimating the temperature of the fuse comprises:
   measuring the magnitude of the current flowing in a strip of said fuse, and
   calculating the temperature of the fuse based on the measured magnitude of the current flowing in the strip of said fuse and of a data model linking temperatures with magnitudes relating to said fuse.

6. The method as claimed in claim 1, further comprising determining a threshold temperature based on a difference between the melting temperature of the fuse and a temperature variation relating to a power that the fuse is liable to dissipate, the power being lower than a melting power of the fuse.

7. The method as claimed in claim 1,
   wherein said periodically estimating comprises adjusting a measured or calculated temperature of the fuse based on a determined ambient temperature of said fuse, and/or
   wherein said periodically estimating and said controlling are implemented by an analog or PID controller algorithm.

8. A non-transitory computer readable medium storing a computer program that, when executing by a processing unit, causes the computer to execute the method as claimed in claim 1.

9. The method as claimed in claim 1, wherein said controlling the magnitude of useful current reduces the temperature of said fuse to below the threshold fuse temperature and to a predetermined stable temperature between the threshold fuse temperature and a hysteresis temperature.

10. The method as claimed in claim 1, wherein said periodically estimating the temperature of said fuse is performed directly via a temperature sensor positioned to sense temperature of a strip of said fuse.

11. A device for protecting an electrical architecture, the device comprising:
   a protective fuse configured to melt in an impaired mode of operation during which a break current, with a magnitude higher than a threshold, flows in the architecture; and
   circuitry configured to
   periodically estimate a temperature of said fuse in a nominal mode of operation, and
   control a magnitude of a useful current flowing in said fuse in the nominal mode of operation such that the estimated temperature remains lower than a melting temperature of said fuse,
   wherein the controlling the magnitude of useful current reduces the temperature of said fuse to below a threshold fuse temperature, responsive to the periodically estimating the temperature resulting in the estimated temperature of the fuse exceeding the threshold fuse temperature, while at the same time limiting the useful current flowing in said fuse to no more than a second maximum magnitude, and
   wherein the threshold fuse temperature is less than the melting temperature of said fuse.

12. The device as claimed in claim 11, further comprising:
   at least one temperature sensor to sense the temperature of the fuse,
   a device to determine an ambient temperature of the fuse and/or at least one device to measure the magnitude of the current flowing in said fuse, and/or
   the circuitry is connected to said at least one temperature sensor, to the at least one device to measure the magnitude of the current flowing in the fuse, and to the device to determine the ambient temperature of the fuse.

13. A vehicle, comprising an electrical architecture provided with the device as claimed in claim 11.

14. The vehicle as claimed in claim 13, wherein the vehicle is an electric or hybrid vehicle.

* * * * *